(12) United States Patent
Li et al.

(10) Patent No.: US 11,139,280 B2
(45) Date of Patent: Oct. 5, 2021

(54) LIGHT EMITTING DEVICE

(71) Applicant: Sean Suixiang Li, Turramurra (AU)

(72) Inventors: Sean Suixiang Li, Turramurra (AU); Anh Pham, Eastgardens (AU)

(73) Assignee: Sean Suixiang Li, Turramurra (AU)

( * ) Notice: Subject to any disclaimer, the term of this patent is extended or adjusted under 35 U.S.C. 154(b) by 0 days.

(21) Appl. No.: 16/721,250

(22) Filed: Dec. 19, 2019

(65) Prior Publication Data

US 2020/0203323 A1    Jun. 25, 2020

(30) Foreign Application Priority Data

Dec. 19, 2018  (AU) .................................. 2018904840

(51) Int. Cl.
| | | |
|---|---|---|
| *H01L 25/075* | (2006.01) | |
| *H01L 27/15* | (2006.01) | |
| *H01L 31/032* | (2006.01) | |
| *H01L 33/62* | (2010.01) | |

(52) U.S. Cl.
CPC ........ *H01L 25/0753* (2013.01); *H01L 27/156* (2013.01); *H01L 31/032* (2013.01); *H01L 33/62* (2013.01)

(58) Field of Classification Search
CPC . H01L 25/0753; H01L 27/156; H01L 31/032; H01L 33/62; H01L 31/036; H01L 31/035218; H01L 33/26; H01L 33/06; H01L 25/0756
See application file for complete search history.

(56) References Cited

U.S. PATENT DOCUMENTS

2020/0035861 A1\*  1/2020  Li .......................... H01L 33/005

\* cited by examiner

*Primary Examiner* — Victor A Mandala
(74) *Attorney, Agent, or Firm* — Polsinelli PC (57) ABSTRACT

The present disclosure relates to a solid-state light-emitting device that comprises at least two light-emitting layers comprising a transition metal dichalcolgenide material with embedded nanoparticles arranged to form an allowable energy level within the bandgap of the transition metal dichalcolgenide layer; the at least two light-emitting layers being sandwiched between two layers of a material with a bandgap larger than the transition metal dichalcolgenide material; and the at least two light-emitting layers being arranged one above the other in a manner such that, light emitted by one of the light-emitting layers travels across the other one of the light-emitting layers; and electrodes arranged to apply a voltage across the two layers of a material with a bandgap larger than the transition metal dichalcolgenide material; wherein, when a voltage within a predetermined range is applied to a pair of electrodes, photons with a predetermined wavelength are emitted by one or more of the at least two light-emitting layers.

8 Claims, 8 Drawing Sheets

FIGURE 8

LIGHT EMITTING DEVICE

CROSS-REFERENCE TO RELATED APPLICATIONS

This application claims priority from Australian provisional application number 2018904840 the entire contents of which are incorporated herein by cross-reference.

FIELD OF THE INVENTION

The present invention relates to a solid-state light-emitting device and methods for fabricating the same. In particular, the present invention relates to a solid-state light-emitting device with tunable light emission and a method for manufacturing the same.

BACKGROUND OF THE INVENTION

Solid-state Light-emitting Devices (LEDs) are widely used nowadays in a wide range of applications, from lighting, displays to electronic communications.

The majority of commercially available solid-state LEDs comprise semiconductor materials and are capable of emitting wavelengths in the same colour range (blue LEDs, green LEDs, etc.).

Furthermore, most LEDs are based on III-V semiconductors, such as gallium nitride (GaN) and indium nitride (InN). A major challenge in commercial gallium nitride based LEDs is that the conversion efficiency of electricity into light (photons) drops as the input current to the device increases. This phenomenon is also known as 'efficiency droop' and is intrinsically linked to the nature of the gallium nitride material.

Recently, commercial LED research has focused on designing tunable wavelength LED with an acceptable power to light conversion efficiency. These LEDs could have a broad range of applications, from LED screens, lighting to wireless telecommunication applications.

The recently proposed designs of gallium nitride-based tunable LEDs rely on altering the band gap of the InGaN/AlGaN heterostructure by varying the indium (In) content in the alloy. This approach, however, can potentially result in multiple defects, given the high concentration of In, and increase the cost of production, as it would require multiple InGaN/AlGaN heterostructures with different indium concentrations assembled in a single platform.

In addition, in Gallium nitride-based LEDs, non-radiative recombination, such as Auger recombination, of electrons and holes becomes an issue when the carrier density is high. This creates a further constraint on the design and application of LED-based electronics. Further, the efficiency droop results in larger thermal dissipation which inhibits nano-scaling of LED devices in electronic devices.

U.S. patent application Ser. No. 16/496,336, the disclosure of which is incorporated herein by reference, describes LEDs based on a semiconductor device that comprises a transition metal dichalcolgenide layer with a plurality of embedded nanoparticles with a predetermined size distribution. In order to control the light emission wavelength of such structure and achieve high efficiency, a high degree of control of the nanoparticles size and size distribution is required.

Metal dichalcolgenide layers with embedded nanoparticles, such as tungsten diselenide flakes or nanoparticles with the specific sizes, have been manufactured in the past using a number of techniques, such as: mechanical exfoliation, physical vapour deposition (PVD), laser radiation, high-energy irradiation, including ion and UV irradiation or recrystallization of amorphous tungsten diselenide ($WSe_2$) layers. All these techniques however, make the control of the nanoparticle size challenging.

SUMMARY OF THE INVENTION

Embodiments of the invention relate to a solid-state light-emitting device (LED) with a tunable emission wavelength and methods for fabricating the LEDs, in particular the light-emitting layers of the device.

The device comprises one or more light-emitting layers, each of which includes a transition metal dichalcolgenide layer that comprises a plurality of embedded nanoparticles. The nanoparticles provide allowable energy levels within the bandgap of the transition metal dichalcolgenide layer.

Other embodiments of the invention provide a methodology for growing a transition metal dichalcolgenide layer with a plurality of embedded nanoparticles, such as tungsten diselenide ($WSe_2$) using a chemical vapour deposition technique. The methodology allows to fabricate the light-emitting layers of the device with a controllable, uniform and high throughput manner.

In accordance with the first aspect, the present invention provides a light-emitting device comprising:

at least two light-emitting layers, each comprising a transition metal dichalcolgenide material with embedded nanoparticles arranged to form an allowable energy level within the bandgap of the transition metal dichalcolgenide layer; the at least two light-emitting layers being sandwiched between two layers of a material with a bandgap larger than the transition metal dichalcolgenide material; and the at least two light-emitting layers being arranged one above the other in a manner such that, light emitted by one of the light-emitting layers travels across the other one of the light-emitting layers; and at least two electrodes arranged to apply a voltage across the two layers of a material with a bandgap larger than the transition metal dichalcolgenide material;

wherein, when a voltage within a predetermined range is applied to a pair of electrodes, photons with a predetermined wavelength are emitted by one or more of the at least two light-emitting layers.

In embodiments, each of the at least two light-emitting layers is sandwiched between two layers of a material with a bandgap larger than the transition metal dichalcolgenide material and the device comprises a plurality of electrodes arranged to apply a voltage across pairs of layers of a material with a bandgap larger than the transition metal dichalcolgenide material.

Each of the transition metal dichalcolgenide layers comprise embedded nanoparticles of a different size and emits photons in a different wavelength range. For example, an LED device may have three transition metal dichalcolgenide layers that emit three different visible colours, such as red, green and blue.

In accordance with the second aspect, the present invention provides a method for forming a layer of a transition metal dichalcolgenide material, the layer comprising a plurality of embedded nanoparticles arranged to form an allowable energy level within the bandgap of the transition metal dichalcolgenide layer; the method comprising the steps of:

depositing nuclei of the transition metal dichalcolgenide on a surface by thermal vapor deposition;

controlling the amount of precursor and deposition temperature while depositing the nuclei to tune the nucleation density; and selenizing the deposited nuclei.

In embodiments, the transition metal dichalcolgenide layer consists of tungsten diselenide. The tungsten diselenide layer may consist of less than 30 atomic monolayers of tungsten diselenide, five atomic monolayers of tungsten diselenide or, in some instances, a single atomic monolayer of tungsten diselenide.

In embodiments, the step of depositing nuclei of the transition metal dichalcolgenide on a surface comprises providing a quartz boat with tungsten oxide powder and loading the quartz boat in a horizontal quartz tube furnace.

In embodiments, the step of depositing nuclei of the transition metal dichalcolgenide on a surface comprises controlling the temperature of the furnace and increasing such temperature to a value between 800° C. and 900° C. over a period of time between 20 minutes and 40 minutes with a constant flow of ultra-high pure Ar gas below 10 Torr.

In embodiments, the step of selenizing the deposited nuclei comprises loading samples with as-deposited nuclei in a furnace with a quartz boat containing Se powders and controlling the temperature of the furnace, during selenization to be between 200° C. and 300° C. for a period of time between 25 minutes and 35 minutes.

In embodiments, some of nanoparticles consist of tungsten diselenide. In some instances, all of the nanoparticles may consist of tungsten diselenide. The tungsten diselenide nanoparticles may be in the form of tungsten diselenide flakes or other forms.

In some embodiments, the light-emitting layers are disposed between two layers of a III-V material, such as boron nitride.

In an embodiment, the voltage within a predetermined range is applied to the pair of electrodes at room temperature and ambient pressure conditions.

In accordance with the third aspect, the present invention provides a method for manufacturing a light-emitting device comprising the steps of:

providing a substrate;

forming at least two light-emitting layers comprising a transition metal dichalcolgenide material with embedded nanoparticles using a method in accordance with the second aspect;

forming at least two layers of a material with a bandgap larger than the transition metal dichalcolgenide material; the at least two light-emitting layers being sandwiched between the at least two layers of a material with a bandgap larger than the transition metal dichalcolgenide material and arranged one above the other in a manner such that, light emitted by one of the light-emitting layers travels across the other one of the light-emitting layers; and forming electrodes arranged to apply a voltage across the two layers of a material with a bandgap larger than the transition metal dichalcolgenide material so that when a voltage within a predetermined range is applied to a pair of electrodes, photons with a predetermined wavelength are emitted by one or more of the at least two light-emitting layers.

Each light-emitting layer contains nanoparticles with a specific size for light emission in a specific wavelength range.

In embodiment, each one of the transition metal dichalcolgenide layers are positioned between a pair of wide bandgap material layers and electrodes are formed in such a way that different voltages can be applied on each pair of wide bandgap material layers.

Embodiments of the present invention allow generating light with different wavelengths using a single solid-state LED device. This allows mitigating efficiency droop problems of current LEDs and reducing size.

Advantages of embodiments of the invention include the capability to control the intensity of emitted light at different wavelengths to achieve precise combinations.

Further, embodiments of the invention may be used for high-resolution screens as they may enable to combine emission different colours in the same chip footprint, therefore reducing the size a pixel in the matrix of pixels.

In addition, the emitted lights with various wavelengths can significantly enhance the capacity of telecommunication signals or channels via the optical fibres or Li-Fi technology.

Furthermore, the lights with the tunable wavelengths emitted by a single LED enables the resolution of LED display to be enhanced dramatically at much lower cost.

The LED with tunable wavelength can also be used for agriculture lightings to facilitate the plant growing.

The LED device can be fabricated on transparent and flexible substrates suitable for wearable mobile and medical devices.

The CVD method for forming a layer of a transition metal dichalcolgenide material with embedded nanoparticles allows for controllable and high throughput manufacturing of the light-emitting layers in comparison to methods used in the art that require manual stacking of the 2D materials exfoliated from singles crystals.

BRIEF DESCRIPTION OF THE DRAWINGS

Features and advantages of the present invention will become apparent from the following description of embodiments thereof, by way of example only, with reference to the accompanying drawings, in which.

DETAILED DESCRIPTION OF EMBODIMENTS

In the following description a solid-state LED device with a tunable emission wavelength and methods for fabricating the LED, in particular the light e-mitting layers of the LED, are described.

In some embodiments, the light-emitting layer of the LED is based on one or more transition metal dichalcolgenide layers that comprise embedded nanoparticles. The nanoparticles form allowable energy levels within the bandgap of the transition metal dichalcolgenide layer. In alternative embodiments, the transition metal dichalcolgenide layers may function as a light-absorbing layers in a PV device.

Figure 1:
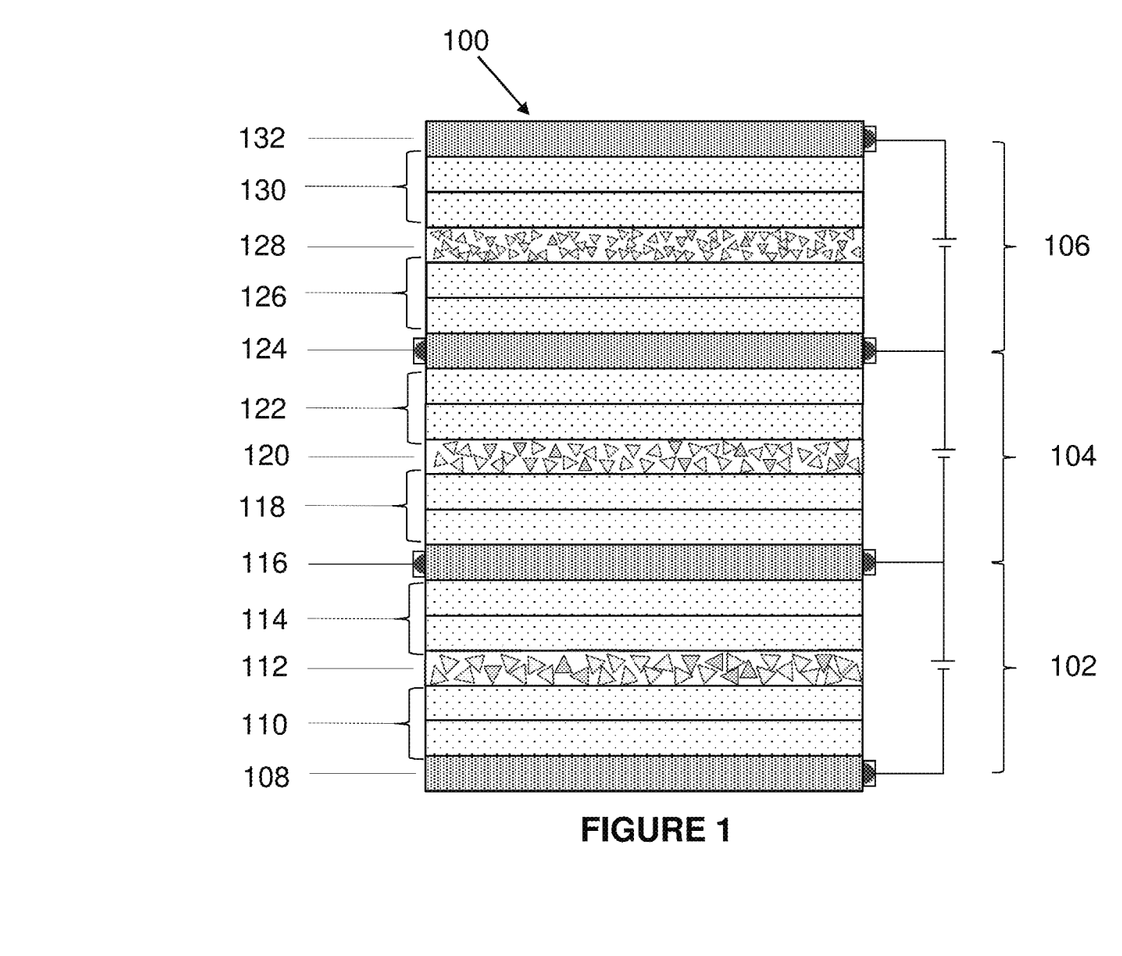
FIGS. 1 and 2 show schematic representations of LED devices in accordance with embodiments.

Referring now to FIG. 1, there is shown a schematic configuration of an LED device 100.

The LED device 100 consists of three light-emitting structures 102, 104, 106 that can emit three basic different colours. The first LED structure 102, for example, comprises graphene electrodes 108, 116 with a thickness of one or more atomic layers and wide band gap hexagonal boron nitride (h-boron nitride) layers 110, 114 with a thickness of one or more molecular layers. The light-emitting layer of the first LED structure 102 comprises tungsten diselenide quantum dots embedded in a tungsten diselenide layer 112 sandwiched between layers the h-boron nitride layers 110, 114. The tungsten diselenide quantum dots have a thickness of only a few atomic layers, in some instances a single atomic layer and are referred in the art as 2-dimensional (2D) quantum dots. The lateral size of the 2D tungsten diselenide quantum dots for the first LED structure 102 is between 9 nm and 10 nm.

In the device 100 of FIG. 1, separate pairs of atomic layers of wide band gap hexagonal boron nitride (h-boron nitride) are used for each of the three light-emitting structures 102, 104, 106. However, a single layer of boron nitride may be used between the tungsten diselenide light-emitting layers.

The light emitted by structure 102 can be controlled by applying a voltage to electrode layers 108 and 116. The emission wavelength is related to the size and size distribution of the quantum dots in the light-emitting layer 112.

The second light-emitting structure 104 shares one of the graphene electrodes 116 with the first light-emitting structure 102. A second graphene electrode 124 is used to apply a voltage across the second light-emitting structure 104. The light-emitting layer of the second LED structure 102 comprises a 2D tungsten diselenide quantum dots embedded in a tungsten diselenide layer 120 sandwiched between layers the h-boron nitride layers 118, 122. The size of the 2D tungsten diselenide quantum dots for the first LED structure 102 is between 5 nm and 6 nm.

The third light-emitting structure 106 shares one of the graphene electrodes 124 with the second light-emitting structure 104. A second graphene electrode 132 is used to apply a voltage across the third light-emitting structure 106. The light-emitting layer of the third light-emitting structure 106 comprises a 2D tungsten diselenide quantum dots embedded in a tungsten diselenide layer 128 sandwiched between layers the h-boron nitride layers 126, 130. The size of the 2D tungsten diselenide quantum dots for the first LED structure 102 is between 2 nm and 3 nm.

Advantages of the LED structure 100 of FIG. 1 include the capability of controlling the emission intensities for each of the three emission wavelengths. In some embodiments, the number of emitting layers may be more than three and the size of the nanoparticles may be modified accordingly. Each tungsten diselenide layer can be manufactured with nanoparticles of the same size to achieve light emission in the desired wavelength range.

In some instances, the stacking sequence may also be altered without affecting the performance of the device.

Figure 2:
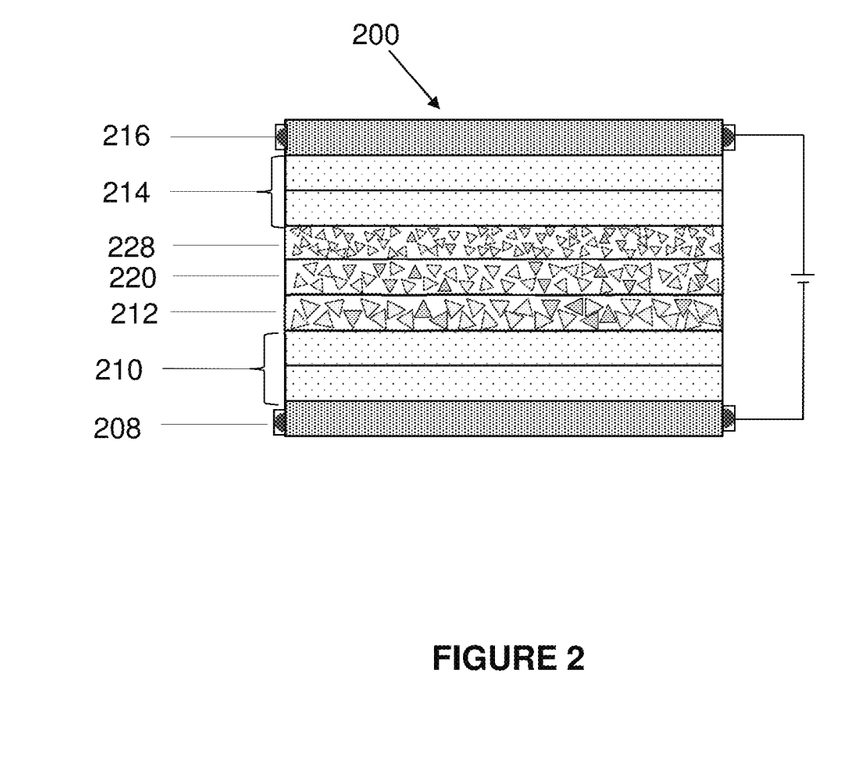

Referring now to FIG. 2, there is shown an LED device 200 in accordance with alternative embodiments. Like the device described above with reference to FIG. 1, the device 200 of FIG. 2 also comprises three light-emitting layers 212, 220, 228, each of which can emit light with within a defined wavelength range. The device 200 also comprises two graphene electrodes 208, 216 with a thickness of one or more atomic layers and two wide band gap h-boron nitride layers 210, 214 with a thickness of one or more molecular layers.

The three light emitting layers 212, 220 and 228 comprises a 2D tungsten diselenide quantum dots embedded in a tungsten diselenide layer with respective average sizes of 9 nm to 10 nm, 5 nm to 6 nm and 2 nm to 3 nm. The LED device 200 of FIG. 1 provides a higher level of integration, with respect to device 100 of FIG. 1, and it is controlled by using only one pair of electrodes. This, in turn, means that the intensity of different wavelengths cannot be controlled with separate voltage signals. In the device 200 of FIG. 2, the relative light intensities can be tuned by controlling the relative amount of nanoparticles in the three light-emitting layers 212, 220 and 228.

For both LED devices of FIG. 1 and FIG. 2, having three separate layers, each embedding nanoparticles of a specific size, allows for an easier control of the nanoparticles number and, therefore, light intensity requirements.

The optimal thickness of the light-emitting layers of the LED device 100 of FIG. 1 can be different to the optimal thickness of the light-emitting layers of the LED device 200 of FIG. 2. The structure of device 200 of FIG. 2 mitigates the challenges in controlling the size of quantum dots and their distribution in one particular layer of tungsten diselenide, but also simplifies and shortens the fabrication processing for the device providing the foundation of manufacturing for large scale production. The level of wavelength tunability however is reduced in respect to device 100 of FIG. 1 given the single control voltage.

For both devices described above with reference to FIGS. 1 and 2 the thickness of tunnel barrier h-boron nitride layers is critical for performance. Carriers are injected from the highly conductive transparent graphene electrodes via the h-boron nitride to the tungsten diselenide layer(s). Such a process requires careful control of the dwell time of the injected electrons and holes in the layer with 2D tungsten diselenide quantum dots. This is because the photoemission is a slow process in comparison with the characteristic time required to penetrate the junction between graphene and tungsten diselenide. If the h-boron nitride layers are too thin or absent, the carriers would directly tunnel from one electrode to another, thus reducing the efficiency of current-to-light conversion as the carriers do not stay in the tungsten diselenide long enough. Therefore, the dwelling time can be controlled by optimizing the thickness h-boron nitride layers as the tunnel barriers. In this invention, layers of h-boron nitride with a thickness of a single molecule to five molecules rare used to increase the time that the electrons and holes spend inside the 2D tungsten diselenide quantum dots to provide radiative recombination.

When a voltage is applied to one of the devices described above with reference to FIG. 1 or 2, electrons and holes enter the device through the conductive electrodes. Electrons and holes recombine in the light-emitting layers and emit photons within a given wavelength range that is determined by the configuration of the allowable energy levels within the bandgap of the light-emitting layer where the radiative recombination is taking place and, in turn, the size of the nanoparticles within the light-emitting layer.

In particular, the radiative recombination process depends on the relative position of the lowest unoccupied state of electrons and the highest occupied state of holes within the light emitting layer. The in-gap states are generated by scaling the tungsten diselenide light-emitting layer to 0D, which exhibit discrete energy levels. When these levels interface with a sizable band gap material with the correct work function the discrete energy levels will be positioned in the middle of the band gap playing the role of the in-gap states.

Like other 2D materials, the graphene, h-boron nitride and tungsten diselenide can be fabricated using physical vapour deposition (PVD), mechanical exfoliation, electrochemical exfoliation and other technologies. As an example, in order to fabricate the high-quality materials, cost effectively on 4 inches substrates or larger size, the Applicants used a new chemical vapour deposition (CVD) technique. The substrates used for the processing can be Nickel (Ni), Copper (Cu), Iron (Fe), sapphire, Germanium (Ge), Ge/Si, $SiO_2$/Si, $SrTiO_3$/GaAs, $SrTiO_3$/Si, SiC and other materials.

Any of the devices described above with reference to FIG. 1 or 2 may be grown, for example, on a Ge template formed on a high-quality silicon wafer. The availability of high-quality, large, single crystal Si wafers is fundamental to current Si-based electronics. It meets the primary requirements of cost-efficient, reliable, and high throughput synthesis over wafer-scale dimensions with methods compatible with current semiconductor technology.

Ge is catalytic active, which can lower the energy barriers for the catalytic decomposition of carbon precursor to induce formation graphitetic carbon. Further, carbon has extremely low solubility in Ge even at the melting temperature of Ge, thus enabling growth the complete monolayer or multilayer graphene; Ge has very similar thermal expansion coefficient with graphene, suppressing intrinsic wrinkle formation in graphene layers.

The crystallographic orientations of the Ge/Si substrates can be (001), (110) and (111) or others. The preparation parameters for the Ge/Si substrates with various crystallographic orientations are the same. For example, to prepare the (110) single crystal Ge film on a (110) Si wafer, the (110) Si wafer is chemically cleaned with 10% diluted HF to remove all types contaminants for creating an H-terminated surface. Subsequently the (110) Si wafer is baked at 1000° C. in ultrahigh purity $H_2$ to remove the native oxide. The as-cleaned (110) Si wafer is immediately loaded into a low-pressure CVD chamber with the pressure of ~$3\times10^{-6}$ Torr. Using the flow rate of 40 sccm, the precursor of Germane ($GeH_4$) gas is purged into the chamber with a pressure from 10~30 Torr at 300~930° C. for 30 mins. With this process, a (110) Ge film with thickness from 1 nm to 1 μm or thicker is formed on the (110) Si wafer. After the Ge growth, the post-annealing at 800° C. in $H_2$ is performed to reduce the threading dislocation density and ready for the fabrication of high-quality graphene electrodes of on the as-prepared substrates.

There are many techniques available to fabricate graphene electrodes with the thickness from monoatomic to multi-atomic layers. For example, after the deposition of the (110) Ge buffer layer on the (110) Si wafer, a mixture gas of Methane ($CH_4$) and ultrahigh purity $H_2$ is purged into the chamber with a total pressure of 100 Torr at 900° C.~930° C. for 5 mins~120 mins. Subsequently, the as-grown material is rapidly cooled to room temperature under vacuum, ready for the deposition of the h-boron nitride tunneling barrier layers.

To grow the h-boron nitride tunneling barrier layers, the as-prepared graphene/Ge/Si is transferred into another chamber to anneal in the purging Ar/$H_2$ or ultra-high purity $H_2$ with the pressure of 800 mTorr at 800° C. for 20 mins and then 1000° C. for 20 mins. At 130° C., the carrier gas Ar/$H_2$ or ultra-high purity $H_2$ takes the precursor ammonia borane ($NH_3$—$BN_3$) into the chamber for h-boron nitride growing. The pressure of Ar/$H_2$ gas or ultra-high purity $H_2$ is kept at 400 mTorr. The thickness of h-boron nitride is controlled by manipulating the growing time from 1 to 60 mins or longer. In fact, the h-boron nitride/graphene layers can also be synthesized with different techniques, precursors and fabrication parameters.

Figure 3:
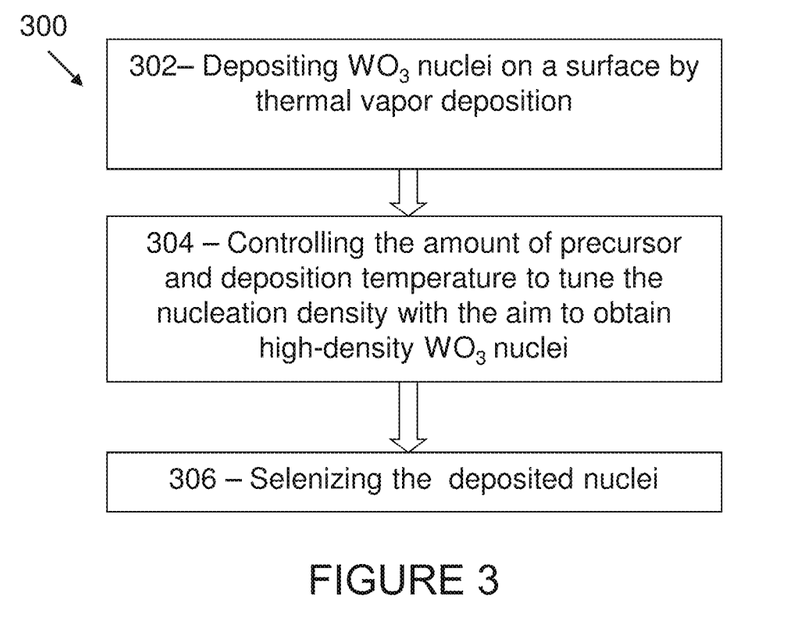
FIG. 3 shows a flow diagram outlining the main steps to fabricate the 2D Tungsten diselenide quantum dot layers using a novel two-steps CVD technique.

Referring now to FIG. 3, there is shown a flow diagram outlining the main steps to fabricate the 2D tungsten diselenide quantum dot layers using a novel two step CVD technique.

In order to reduce the lateral size of tungsten diselenide nanosheets to less than 20 nm (quantum dots), the first step is to deposit tungsten oxide ($WO_3$) nuclei on the surface of a substrate, such as a (0001) sapphire substrate or a surface of a h-boron nitride layer of the LED device, by thermal vapor deposition 302. The amount of precursor and deposition temperature is controlled 304, to tune the nucleation density with the aim to obtain high-density tungsten oxide nuclei. A tungsten oxide powder and a Selenium powder are used as precursor and reactant material. Subsequently the tungsten oxide nuclei are selenized 306 to form the nanoparticles.

In order to form the tungsten oxide nuclei and subsequently tungsten oxide with an average size of 10 nm, a quartz boat with 0.01 g tungsten oxide powder was loaded in the centre of a 25-diameter horizontal quartz tube furnace. The substrate is placed downstream, 1 cm away from the edge of the heating zone. During the deposition, the temperature of the furnace was slowly increased to 850° C. over 30 min with a constant flow of 70 sccm ultra-high pure Ar gas under 10 Torr. When the temperature reached the set value, heating is stopped immediately, and the furnace is opened to cool down to room temperature naturally.

To selenize the tungsten oxide nucleuses, the sample with as-deposited TUNGSTEN OXIDE nucleuses is reloaded to another quartz tube in the centre of the furnace. A quartz boat with 0.25 g of Se powder is placed in the upstream heating zone and maintained at 260° C. during the selenization process. The temperature of the centre furnace is raised to 450° C. over 20 min and maintained for 30 min. Finally, the furnace is cooled down to room temperature. During the whole process, 70 sccm Ar gas and 10 sccm $H_2$ gas are introduced as the carrier gas at atmosphere pressure.

tungsten diselenide nanosheets with different sizes can be grown with a similar process to the tungsten diselenide QDs. The main difference is the amount of precursor, substrate treatment and growth temperature. For 100 nm and 200 nm tungsten diselenide nanosheets, the amounts of tungsten oxide powder are 0.25 g for both powders. The deposition time of the tungsten oxide nuclei are 5 min and 10 min, respectively, at 850° C. The selenizing process is the same as for tungsten diselenide QDs. Another difference for the tungsten diselenide monolayer film, the amount of tungsten oxide powder is kept at 0.25 g, and the deposition time is increased to 30 mins. When the selenizing temperature reaches 850° C., the tungsten diselenide domains would be aligned and stitched to form seamless monolayer film.

Figure 4:
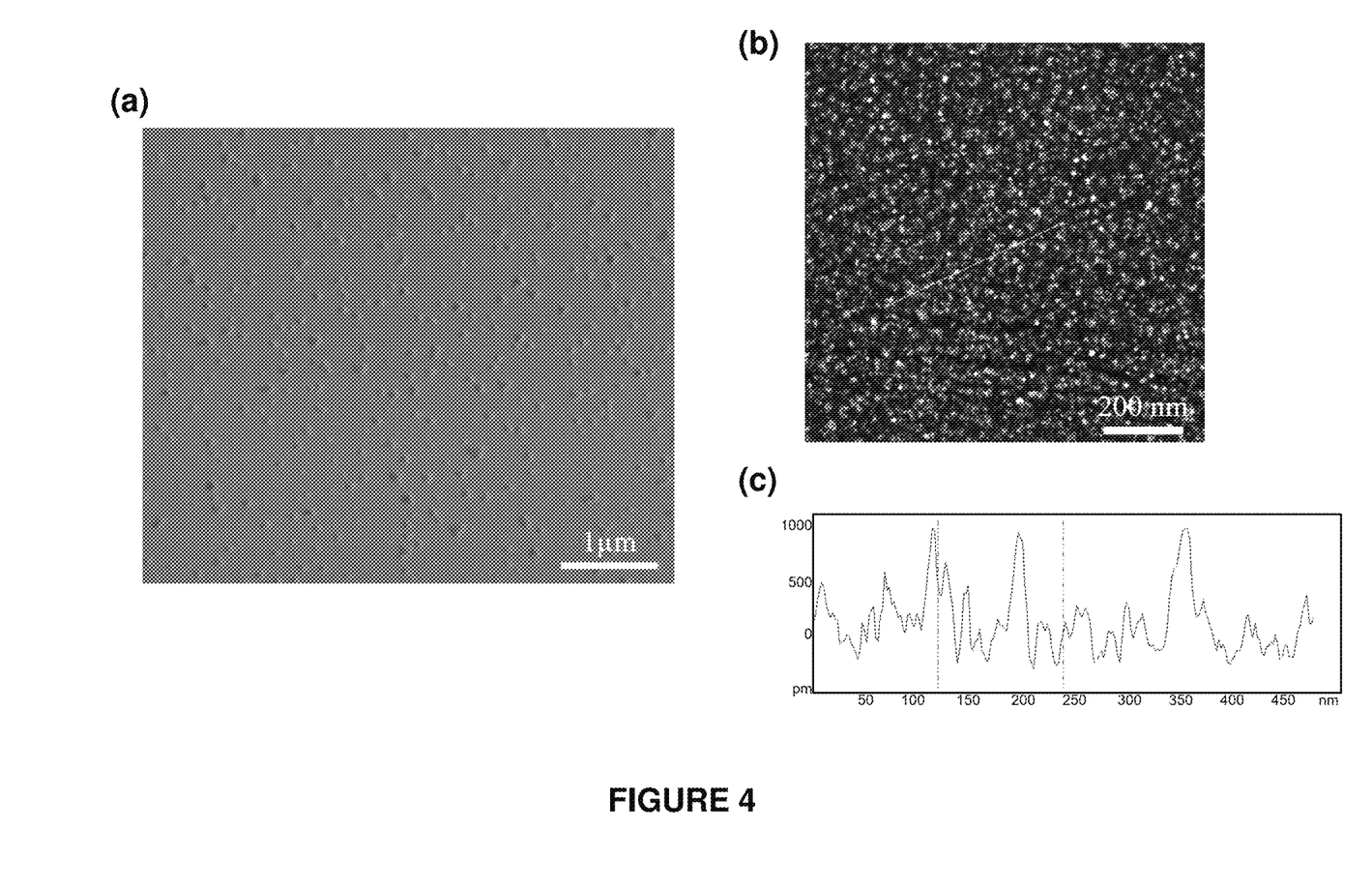
FIG. 4 shows a scanning electron microscope (SEM) image of the 2D tungsten diselenide quantum dot layers (a); an AFM image of as-grown tungsten diselenide QDs on sapphire (b) and the height profile of the QDs (c)

FIG. 4(a) shows a scanning electron microscope (SEM) image of the 2D tungsten diselenide quantum dot layers with a lateral size of ~10 nm. The layer was grown on a sapphire substrate for convenience.

FIGS. 4(b and c) show an AFM image of as-grown tungsten diselenide QDs layer on sapphire and its height profile respectively. The AFM data show that the QDs typically have a thickness of 0.9 nm and demonstrates the successful fabrication of monolayer tungsten diselenide QDs with a controllable lateral size of 10 nm.

Figure 5:
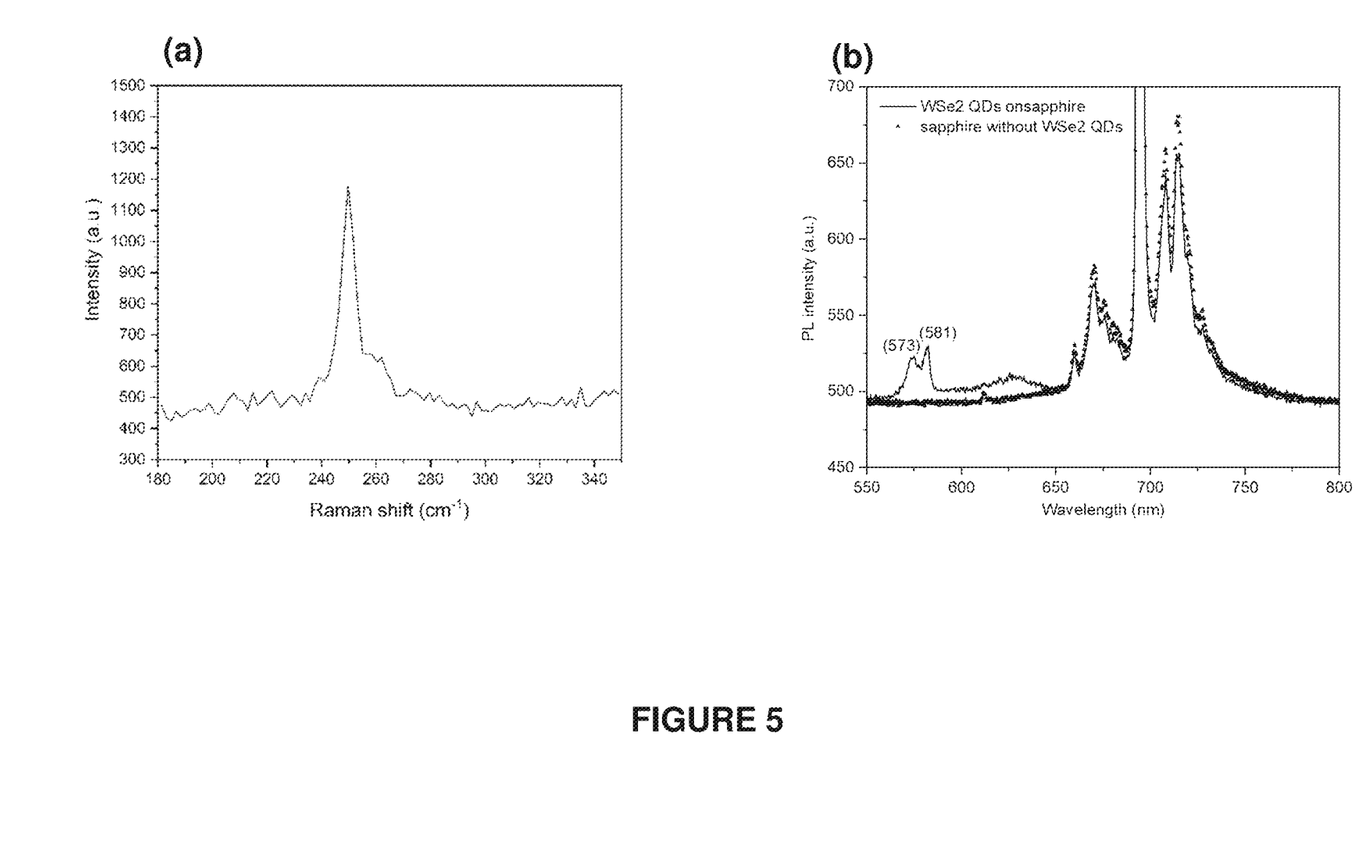
FIG. 5 shows a Raman spectrum (a) and a PL spectrum (b) of tungsten diselenide QDs fabricated in accordance with embodiments.

FIG. 5 shows a Raman spectrum (a) and a PL spectrum (b) of tungsten diselenide QDs fabricated in accordance with embodiments.

The Raman spectrum of tungsten diselenide QDs shown is FIG. 5 demonstrates a strong peak at 249 cm$^{-1}$, which is the characteristic peak of monolayer tungsten diselenide, supporting the finding shown in FIG. 4. By subtracted the PL spectra of the sapphire substrate, the distinct multipeaks at 573 nm and 581 nm in the PL spectra of tungsten diselenide QDs are discernible. Comparing with a general monolayer tungsten diselenide film, the characteristic peak was blue-shifted from 750 nm to 581 and 573 nm, demonstrating the QD effects. This evidences the strong size dependent bandgap energy of monolayer tungsten diselenide sheets in quantum dot scale as requested for the invented device structures shown in FIGS. 1 and 2.

Figure 6:
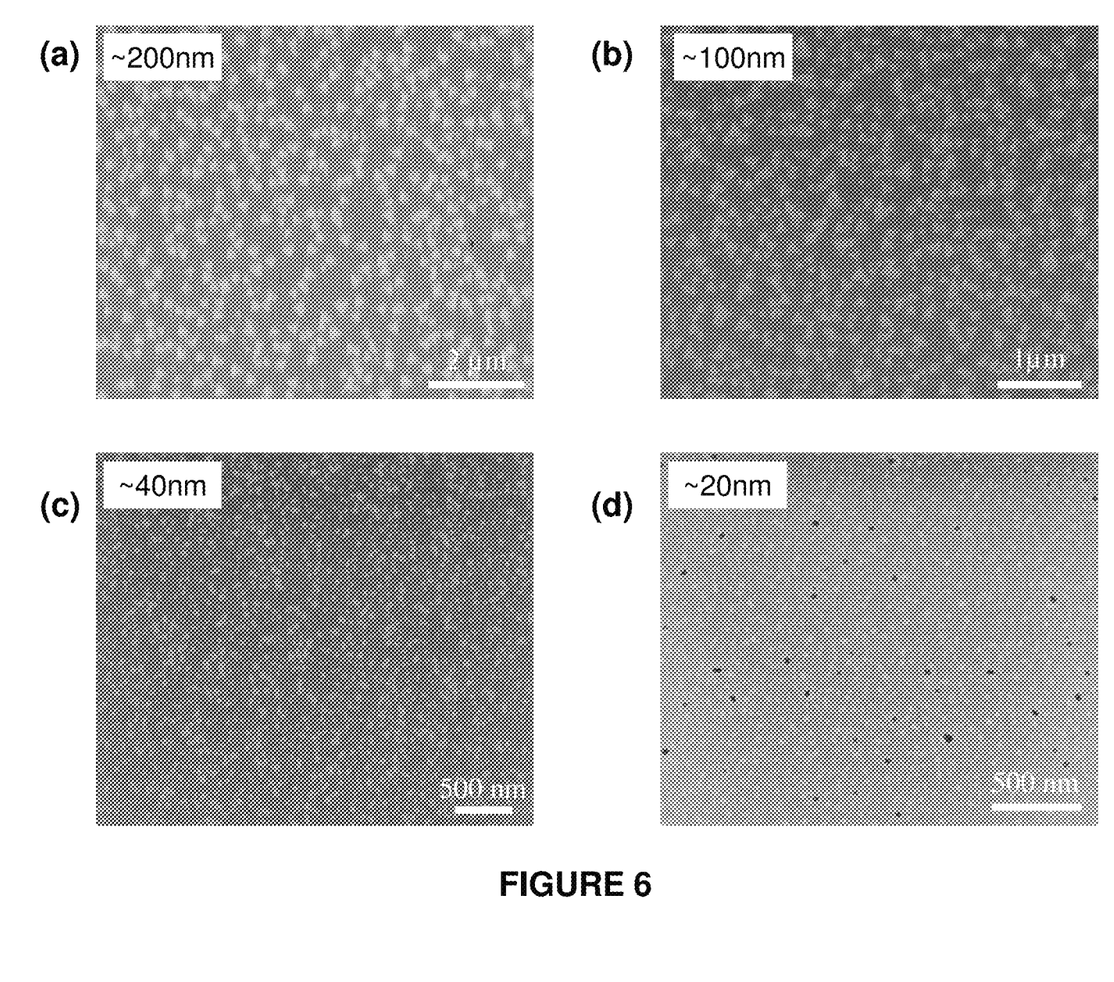
FIG. 6 shows SEM images of tungsten diselenide nanosheets with various sizes.

FIG. 6. SEM images of tungsten diselenide nanosheets with various sizes.

In addition to the as-synthesized tungsten diselenide, we can also grow various tungsten diselenide nanosheets with a series of sizes ranging from a few hundred nanometres to tens of nanometres and then several nanometres or smaller. This can be achieved by controlling the growing temperature (from 350° C. to 1050° C.) and surface energy (H2 treatment, plasmas and UV surface treatments and others) and more key thermodynamic parameters, providing indispensable reference for fabrication of the light emitting devices shown in FIGS. 1 and 2.

Figure 7:
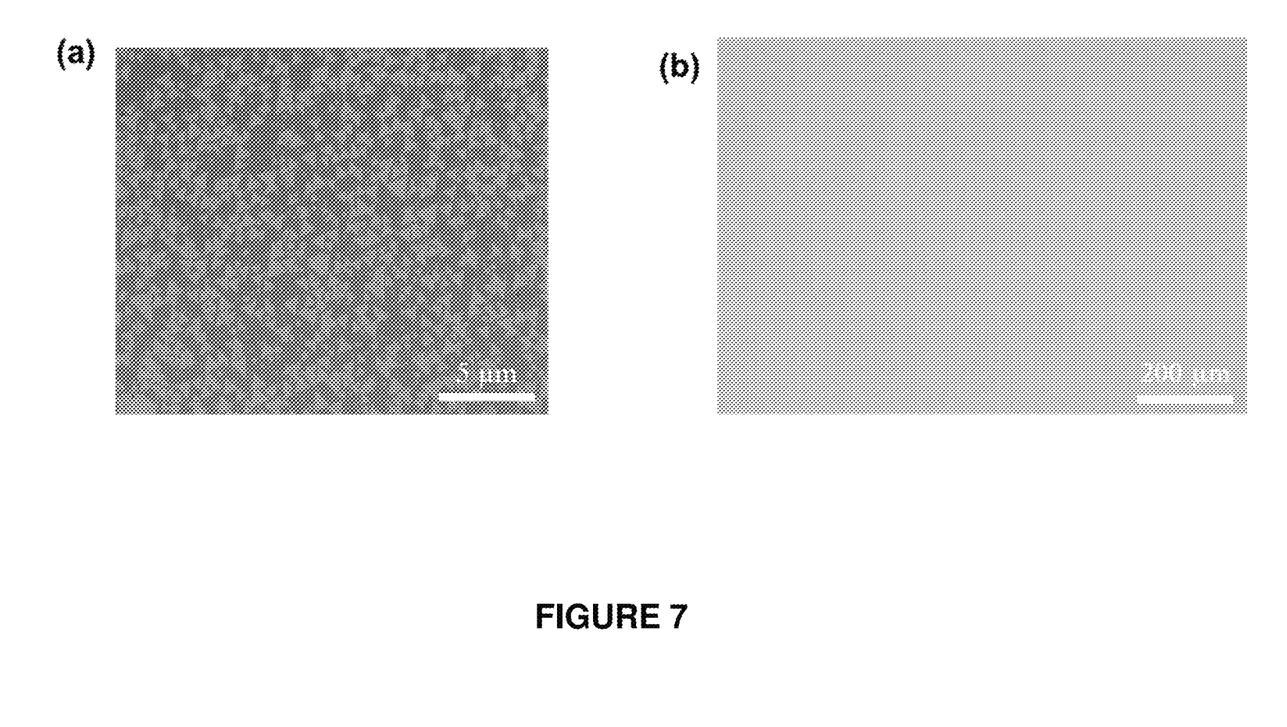
FIG. 7 shows an SEM image of aligned tungsten diselenide nanosheets (a) and OM image of continuous monolayer tungsten diselenide film on sapphire (b)

FIG. 7 shows an SEM image of aligned tungsten diselenide nanosheets what were grown at the temperature of 850° C. (a) and OM image of continuous monolayer tungsten diselenide film on sapphire the aligned tungsten diselenide nanosheets makes it possible to seamlessly stitch together to form a wafer-scale monolayer tungsten diselenide film (b). From the SEM morphology of tungsten diselenide grown at the temperature of 850° C., it is discernible that these as-grown tungsten diselenide nanosheets are mostly 0°/180° aligned along the substrate. As is well known, there is "energy sink" on the surface of the sapphire. At high temperature, the nucleation will overcome the energy barrier to adjust the orientation of nucleus and finally align well the energy sink on the surface. The well-aligned tungsten diselenide nanosheets were seamlessly joined together to form a wafer-scale monolayer tungsten diselenide film (FIG. 7b), demonstrating the identical orientation of the as-grown tungsten diselenide monolayer nanosheets. This eliminates the crystallographic orientation effects on the bandgap energy of tungsten diselenide QDs.

The near mono-dispersed and near identical crystallographic orientation of tungsten diselenide QDs fabricated with the invented technique described above ensures the uniformity and chromatic light emitting with the specific wavelengths from the individual tungsten diselenide layers of device structures shown in FIGS. 1 and 2.

The growth of high-quality and large-scale film of monolayer tungsten diselenide quantum dots is still challenging. The main hurdle is to align these nucleated tungsten diselenide domains precisely and stitch them to form uniform and seamless film. Here we also demonstrate the fabrication large-area film of monolayer tungsten diselenide quantum dots (FIG. 7) by controlling the deposition time and growth temperature. We found that at high temperature, these domains mostly 0°/180° aligned along the substrate, which makes it possible to seamlessly stitch together.

Scanning electron microscope (SEM) images were taken on by using a FEI Nova Nano SEM 230. Atomic force microscopy (AFM) measurements were carried out by Bruker Dimension ICON SPM with noncontact mode. Optical microscopy measurements were performed by Nikon 200. PL spectra measurements were performed at room temperature by a homemade laser PL spectroscopy system (CrystaLaser, Model BLC-050-405). The excitation wavelength for PL measurements is 800 nm. Raman spectrum were collected with inVia Raman microscopy, Renishaw, 532 nm LASER.

The fabrication parameters for spectrally tunable LEDs described can be altered depending on the instruments and synthesise techniques. For example, the flow rate of carrier gas or pressure is determined by the size and shape of the chambers. The temperature can also be lowered if Plasma Enhanced Chemical Vapour Deposition (PECVD) is used for the fabrication. The graphene/h-boron nitride/tungsten diselenide/h-boron nitride/graphene layers can also be grown on the other catalysts, such as Cu foils first and then transferred on the $SiO_2$/Si substrate.

2D materials have emerged as a promising material candidate for flexible and inexpensive optoelectronic devices since they can be fabricated on a wide range of substrate through simple chemical or physical deposition technique. Transition metal dichalcogenide (TMD) materials, like $MoS_2$, have demonstrated its ability as a material candidate for LED device. However, $MoS_2$-based LED devices have many disadvantages, such as low efficiency and broad line-width emission. Further, these devices only function in cryogenic temperature. LED devices based on other 2D materials, such as reduced graphene/graphene oxide have been reported as the first tunable visible colour LED, but these graphene-based devices can only operate for tens of seconds in ambient environment. These limitations affect the applications range of many 2D materials as LED devices.

$WSe_2$, unlike other 2D transition metal dichalcogenides and graphene-based LED, shows exceptional light-emitting efficiency with narrow bandwidth due to the emission originated the exciton binding of electron and hole and the large spin-orbit splitting. In addition, tungsten diselenide-quantum well-based LED devices can operate without degrading performance at room temperature under ambient pressure. The device disclosed herein uses a light-emitting layer based on tungsten diselenide and embedded nanoparticles to create in-bandgap radiative states.

Tungsten diselenide nanoparticles are used is used in the device described herein to obtain 0D exciton emission. The sample size can be controlled in a wide range of method ranging from physical vapour deposition to mechanical exfoliation using nanotechnology. By controlling the sizes of the tungsten diselenide nanoparticles the light-emission properties of the LED can be controlled.

In device described, the tungsten diselenide monolayer with embedded tungsten diselenide flakes is positioned between layers boron nitride to create a sharp emission peak. The quantum well structure enhances the emission intensity of the tungsten diselenide monolayer and significantly reduce the bandwidth of the emission peak due to the nature of the confined tungsten diselenide layer. In addition, the wide band gap materials will not participate in the emission process since the applied voltage does not alter the chemical potential close to their conduction band due to their very large energy gap. Finally, to control the position of the Fermi level, the top and bottom electrodes are placed on top and at the bottom of the quantum well structure. These electrodes can be made of different transparent conductive materials such as conductive oxides including indium thin oxide (ITO) and zinc oxide (ZnO), conductive polymers, metal, alloys, carbon materials, like graphene, and phase-engineered TMD material like 1T-tungsten diselenide. These layers play the role of the carrier injection into layer to change the positions of the Fermi level and, therefore, the emission wavelength.

When a quantum dot-2D TMD hybrid structure undergoes an optical excitation, this creates an exciton whose energy is different from the exciton energy of the QD and of the 2D materials. This hybrid exciton is formed based on the electron resided on the QD structures, and the hole resides on the 2D TMD layer.

In alternative embodiments, different quantum dot materials, such as lead sulphide (PbS), cadmium sulphide (CdS), cadmium selenide (CdSe), and anti-perovskite halides may be used in the light-emitting region of the device. By selecting the appropriate material and the size of the quantum dot, the hybrid exciton energy levels and bandwidth can be tuned in a wide range. In addition, the QDs may be fabricated by conventional chemical synthesis which is inexpensive. Such a device based on the appropriate selection of the QD material provides a new efficient tunable LED device. Furthermore, the efficiency and performance of the tungsten diselenide-QD layer.

Figure 8:
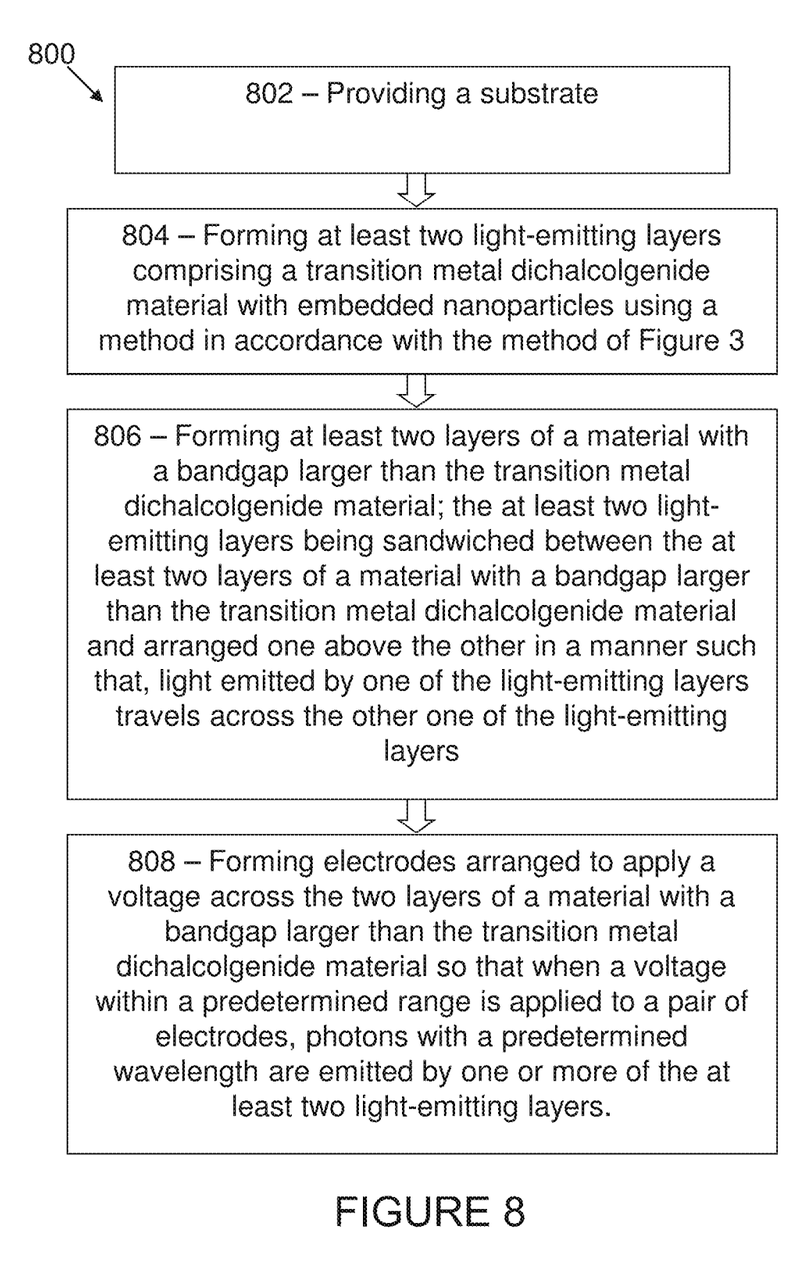
FIG. 8 is a flow diagram listing method steps used to manufacture an LED device in accordance with FIG. 1.

Referring now to FIG. 8, there is shown a flow diagram 800 listing method steps used to manufacture an LED in accordance with FIG. 1. A substrate to host the LED device is provided 802. At least two light-emitting layers comprising a transition metal dichalcolgenide material with embedded nanoparticles are formed using the method described with reference to FIG. 3 804. Furthermore, at least two layers of a material with a bandgap larger than the transition metal dichalcolgenide material are formed 806. The at least two light-emitting layers being sandwiched between the at least two layers of a material with a bandgap larger than the transition metal dichalcolgenide material and arranged one above the other in a manner such that, light emitted by one of the light-emitting layers travels across the other one of the light-emitting layers. Therefore, it understood that light-emitting layers and wide-bandgap layers may be formed in an alternate manner to fabricate a structure such as the LED device of FIG. 1. In addition, electrodes arranged to apply a voltage across the two layers of a material with a bandgap larger than the transition metal dichalcolgenide material are formed 808 so that when a voltage within a predetermined range is applied to a pair of electrodes, photons with a predetermined wavelength are emitted by one or more of the at least two light-emitting layers.

Each light-emitting layer contains nanoparticles with a specific size for light emission in a specific wavelength range.

In embodiment, each one of the transition metal dichalcolgenide layers are positioned between a pair of wide bandgap material layers and electrodes are formed in such a way that different voltages can be applied on each pair of wide bandgap material layers.

The light emission wavelengths of the LED with the tunable tungsten diselenide-based emitting layer are tunable between 450 nm and 775 nm dependent on the embedded materials in the tungsten diselenide-based layer.

The emitting layer tungsten diselenide-QD can be used as many-body excitonic emission for photovoltaic devices. The QD is dispersed in the single layer tungsten diselenide. The exciton is formed between the holes in tungsten diselenide and electron in the QD. The exciton lifetime and wavelength can be tuned by changing the chemical composition and the sizes of the QDs.

The emitting layer can comprise a multilayer of single tungsten diselenide-QD like tungsten diselenide-QD-TMD, in which the QD is embedded between the tungsten diselenide single layer and another single layer TMD to tune the excitonic lifetime and wavelength.

In embodiments, a power conversion efficiency (PCE) for the PV device higher than the theoretical efficiency of conventional organic dye (~8.1%) solar cell can be obtained.

In alternative embodiments, different confining layers can be used instead of boron nitride. Using wide bandgap perovskite materials, for example, can be useful for display, communications and lighting applications.

Other applications of the technology described herein include: variable wavelength LEDs for enhancing the capacity of telecommunication signals or channels via wireless telecommunication or optical fibres; enhanced LED displays; agriculture lightings; medical lighting; sterilization; wearable mobile communication and medical devices. Further, the tungsten diselenide-based emitting layer can be used as saturable absorber for tunable wavelength lasers.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A light-emitting device comprising:
   at least two light-emitting layers, each comprising a transition metal dichalcolgenide material with embedded nanoparticles arranged to form an allowable energy level within the bandgap of the transition metal dichalcolgenide layer; the at least two light-emitting layers being sandwiched between two layers of a material with a bandgap larger than the transition metal dichalcolgenide material; and the at least two light-emitting layers being arranged one above the other in a manner such that, light emitted by one of the light-emitting layers travels across the other one of the light-emitting layers; and
   at least two electrodes arranged to apply a voltage across the two layers of a material with a bandgap larger than the transition metal dichalcolgenide material;
   wherein, when a voltage within a range is applied to a pair of electrodes, photons with a wavelength are emitted by one or more of the at least two light-emitting layers.

2. The device of claim 1 wherein, each of the at least two light-emitting layers is sandwiched between two layers of a material with a bandgap larger than the transition metal dichalcolgenide material and the device comprises a plurality of electrodes arranged to apply a voltage across pairs of layers of a material with a bandgap larger than the transition metal dichalcolgenide material.

3. The device of claim 1, wherein the voltage within a predetermined range is applied to the pair of electrodes at room temperature and ambient pressure conditions.

4. The device of claim 1, wherein the transition metal dichalcolgenide layer consists of tungsten diselenide.

5. The device of claim 1, wherein the tungsten diselenide layer consists of less than 30 atomic monolayers of tungsten diselenide, five atomic monolayers of tungsten diselenide or, a single atomic monolayer of tungsten diselenide.

6. The device of claim 1, wherein the nanoparticles consist of tungsten diselenide.

7. The device of claim 1, wherein the tungsten diselenide nanoparticles are in the form of tungsten diselenide flakes.

8. The device of claim 1, wherein the light-emitting layer, or layers, are disposed between two layers of a wide bandgap materials.

\* \* \* \* \*